(12) United States Patent
Suzuki

(10) Patent No.: US 7,152,300 B1
(45) Date of Patent: Dec. 26, 2006

(54) METHOD OF MANUFACTURING A MICROMECHANICAL STRUCTURE

(75) Inventor: Kenichiro Suzuki, Tokyo (JP)

(73) Assignee: Denso Corporation, Kariya (JP)

( * ) Notice: Subject to any disclaimer, the term of this patent is extended or adjusted under 35 U.S.C. 154(b) by 792 days.

(21) Appl. No.: 09/702,881

(22) Filed: Nov. 1, 2000

Related U.S. Application Data

(62) Division of application No. 09/075,265, filed on May 11, 1998, now Pat. No. 6,191,518.

(30) Foreign Application Priority Data

May 12, 1997 (JP) .................................. 8-120886

(51) Int. Cl.
*H02K 15/00* (2006.01)
*H02K 15/14* (2006.01)
*H02K 15/16* (2006.01)

(52) U.S. Cl. ................. 29/596; 29/592.1; 29/595; 29/603.01; 310/309

(58) Field of Classification Search ............ 29/603.01, 29/603.03, 603.18, 603.25, 596, 595; 310/309
See application file for complete search history.

(56) References Cited

U.S. PATENT DOCUMENTS

| | | | |
|---|---|---|---|
| 4,997,521 A * | 3/1991 | Howe ........................ 156/651 |
| 5,043,043 A | 8/1991 | Howe et al. ................. 216/17 |
| 5,072,288 A | 12/1991 | MacDonald et al. ........ 257/420 |
| 5,428,259 A | 6/1995 | Suzuki ....................... 310/309 |
| 5,512,374 A | 4/1996 | Wallace et al. ............. 428/422 |
| 5,583,736 A | 12/1996 | Anderson et al. .......... 361/234 |
| 5,635,640 A | 6/1997 | Geen ....................... 73/504.12 |
| 5,658,698 A * | 8/1997 | Yagi ........................... 430/11 |
| 5,784,189 A | 7/1998 | Bozler et al. .............. 359/254 |
| 5,812,362 A | 9/1998 | Ravi .......................... 361/341 |
| 5,994,750 A * | 11/1999 | Yagi .......................... 257/415 |
| 6,020,215 A * | 2/2000 | Yagi ............................ 438/52 |
| 6,198,145 B1 * | 3/2001 | Ferrari ....................... 257/415 |

FOREIGN PATENT DOCUMENTS

| | | |
|---|---|---|
| JP | 2-230779 | 9/1990 |
| JP | 4-340371 | 11/1992 |
| JP | 6-245551 | 9/1994 |
| JP | 7-308080 | 11/1995 |
| JP | 7-322648 | 12/1995 |
| JP | 8-23685 | 1/1996 |
| JP | 8-180623 | 7/1996 |
| JP | 9-163761 | 6/1997 |

OTHER PUBLICATIONS

"A three-degrees-of-freedom micromotion in-parallel actuated manipulator", Lee, K.-M.; Arjunan, S.; Robotics and Automation, IEEE Transactions on vol. 7, Issue 5, Oct. 1991; pp. 634-641.*

(Continued)

*Primary Examiner*—Paul D. Kim
(74) *Attorney, Agent, or Firm*—Posz Law Group, PLC

(57) ABSTRACT

A microactuator includes a stationary element, a movable element, and a first microstructure. The stationary element is fixed on a substrate and has a plurality of stationary element electrodes arranged at a predetermined pitch. The movable element has a plurality of movable element electrodes opposing to the stationary element electrodes. The movable element is moved by applying a voltage across the stationary element and the movable element. The first microstructure is formed on at least one of the opposing surfaces of the movable element and the stationary element to prevent the movable element from attaching to the stationary element.

7 Claims, 12 Drawing Sheets

OTHER PUBLICATIONS

Long-Sheng Fan, et al., "Magnetic Recording Head Positioning at Very High Track Densities Using a Microactuator-Based, Two-State Servo System," *IEEE Transactions on Industrial Electronics*, vol. 42, No. 3, Jun. 1995, pp. 222-233.

Youngjoo Yee, et al., "Polysilicon Surface Modification Technique to Reduce Sticking of Microstructures," *Transducers '95—Eurosensors IX*, Jun. 1995, pp. 206-209.

A. Benitez, et al., "Bulk silicon microelectromechanical devices fabricated from commercial bonded and etched-back silicon-on-insulator substrates," *Sensors and Actuators A*, 1995, pp. 99-103.

* cited by examiner

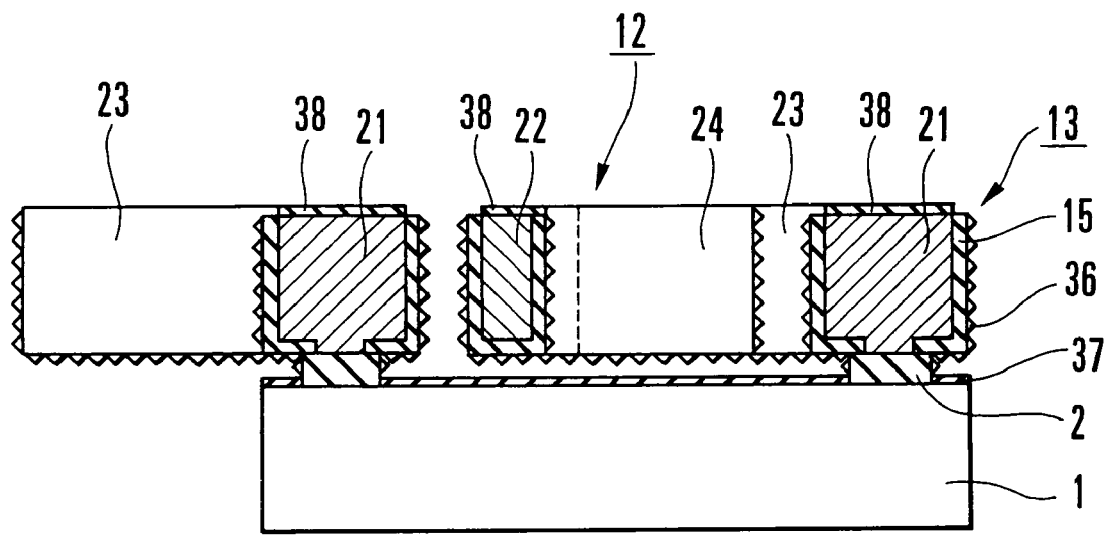
F I G. 4
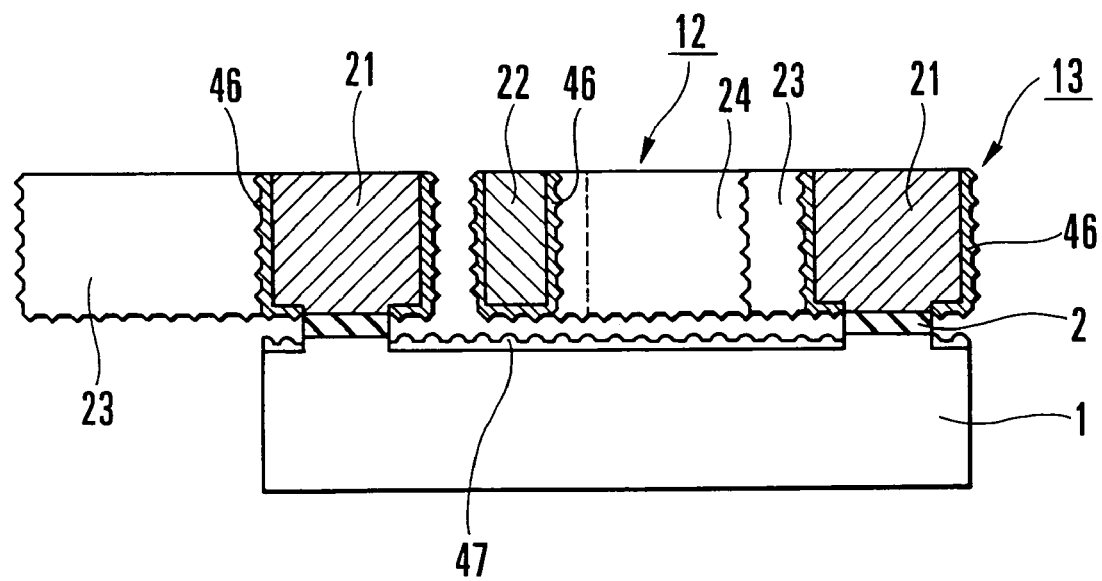
F I G. 5

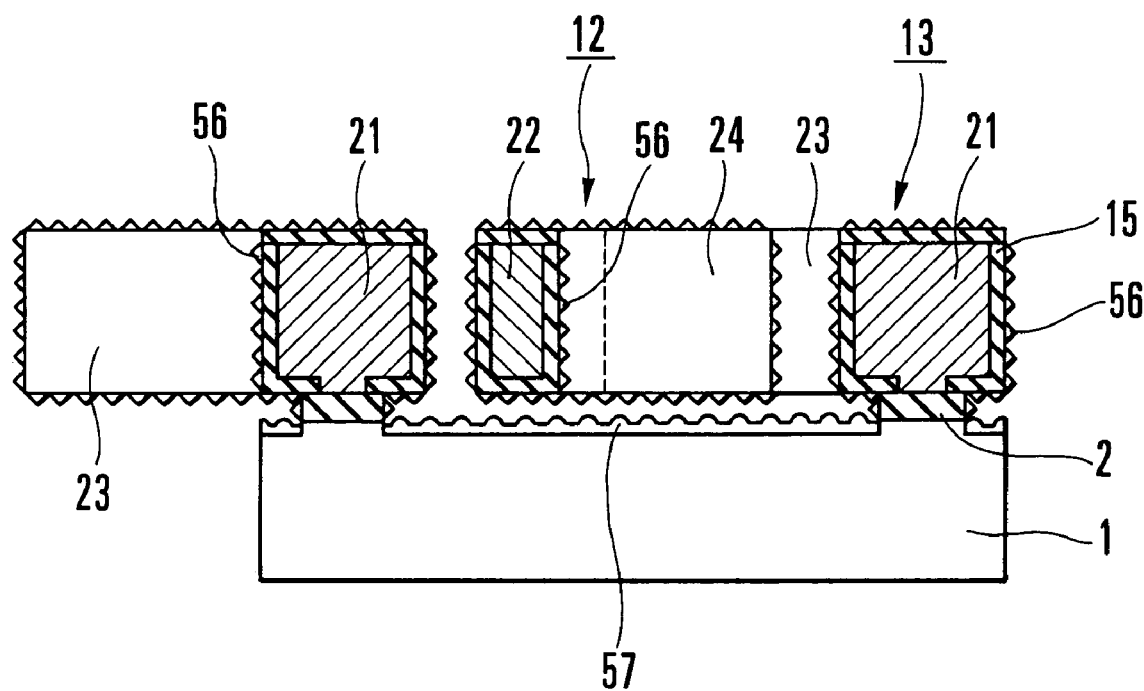
F I G. 6

METHOD OF MANUFACTURING A MICROMECHANICAL STRUCTURE

This is a division of application Ser. No. 09/075,265 filed May 11, 1998, now U.S. Pat. No. 6,191,518.

BACKGROUND OF THE INVENTION

The present invention relates to a microactuator used to drive optical components and small-size magneto-optical/magnetic disk components, and a method of manufacturing the same.

A microactuator (electrostatic actuator) is generally proposed in which a movable element made of an insulating substance is moved by an electrostatic force generated between a plurality of stationary electrodes and the charges induced by the movable element when a voltage is applied to the plurality of stationary electrodes opposing the movable element at a small gap.

A microactuator mounted at the distal end of a suspension supported by an arm in a magnetic disk apparatus to drive a magnetic head formed integrally with a slider is proposed in L. S. Fan et al., "Magnetic Recording Head Positioning at Very High Track Densities Using a Microactuator-Based, Two-Stage Servo System", IEEE Transactions on Industrial Electronics, Vol. 42, No. 3, pp. 222–233, June 1995 (reference 1).

FIG. 12 shows a microactuator described in reference 1.

In FIG. 12, the conventional microactuator is constituted by a pair of T-shaped stationary elements 83 and 84 which are formed on a silicon substrate (to be described later) and have the distal ends of leg portions opposing each other, and an H-shaped movable element 82 formed between the stationary elements 83 and 84. The movable element 82 is supported by four springs 81 to float above the silicon substrate. One end of each spring 81 is fixed to a corresponding one of a pair of spring bases 80 fixed to the silicon substrate, and the entire spring 81 is separated from the silicon substrate.

The stationary elements 83 and 84 are respectively made up of main body portions 83a and 84a, and support portions 83b and 84b constituting leg portions vertically extending from the centers of the main body portions 83a and 84a. The end portions of the support portions 83b and 84b oppose each other. Many comb tooth portions 91 are formed in a comb tooth shape at a predetermined pitch in two lines on the two sides of each of the support portions 83b and 84b. As shown in FIG. 13, many stationary element electrodes 93 are formed at a predetermined pitch in a comb tooth shape on one side of each comb tooth portion 91.

The movable element 82 is made up of a pair of parallel support portions 82a and a coupling portion 82b coupling the centers of the support portions 82a. The movable element 82 is combined with the stationary elements 83 and 84 to constitute an actuator. That is, the support portions 82a of the movable element 82 are arranged parallel to sandwich the support portions 83b and 84b of the stationary elements 83 and 84. The coupling portion 82b of the movable element 82 vertically crosses the gap formed by the end portions of the support portions 83b and 84b of the stationary elements 83 and 84.

The movable element 82 comprises many comb tooth portions 92 formed in a comb tooth shape at the same pitch as that between the comb tooth portions 91 of the stationary elements 83 and 84. The comb tooth portions 91 of the stationary elements 83 and 84 and the comb tooth portions 92 of the movable element 82 overlap and interdigitated with each other. As shown in FIG. 13, movable element electrodes 94 to be inserted between the stationary element electrodes 93 are formed on one side of each comb tooth portion 92. The comb tooth portion 91 of each of the stationary elements 83 and 84 has a larger width than that of the comb tooth portion 92 of the movable element 82. The stationary element electrode 93 has a larger width than that of the movable element electrode 94.

As shown in FIG. 14, the comb tooth portion 91 formed integrally with the stationary element electrode 93 is fixed to a silicon substrate 100 via a stationary element base 101. In contrast to this, the comb tooth portion 92 formed integrally with the movable element electrode 94 is separated from the silicon substrate 100, i.e., floats above the surface of the semiconductor substrate 100 at a predetermined interval.

In this arrangement, the movable element 82 can be moved right or left in FIG. 12, i.e., the comb tooth portion 92 can be moved in a direction to come close to and separate from the comb tooth portions 91 by applying a voltage across the movable element electrode 94 of the comb tooth portion 92 and the stationary element electrodes 93 of the stationary elements 83 and 84. In this case, the movable element 82 can be moved left by applying a voltage to the left stationary element 84, or right by applying a voltage to the right stationary element 83.

A method of manufacturing the microactuator having this arrangement will be explained. A 2-μm thick PSG (Phospho-Silicate Glass) film is patterned in a region on the silicon substrate 100 where the movable element 82 is to be formed. Copper is plated between resist patterns formed on the PSG film using photolithography.

The PSG film is removed using hydrofluoric acid to separate the movable element 82 including the movable element electrode 94 from the silicon substrate 100, thereby forming the copper-plated movable element 82. In this way, the microactuator in reference 1 using a 20-μm thick copper material is manufactured.

In a microactuator using a silicon IC process, a structure using a polysilicon thin film has conventionally been known well. Compared to the electroplated actuator, the microactuator with a polysilicon structure has good matching with the silicon IC process and exhibits excellent mechanical characteristics. Note that in applications to a magnetic/magneto-optical head and the like, movement of the head in directions other than a desired direction must be suppressed small.

In the microactuator shown in FIG. 12, the movable element 82 must move right and left in FIG. 12, but its movement in a direction perpendicular to the surface of the silicon substrate 100 must be suppressed as small as possible. From this condition, the spring 81 must be made thick. The movable element electrode 94 and the stationary element electrode 93 must also be made thick in order to use a large electrostatic force.

From these conditions, a microactuator having an electrode thickness of 20 μm or more must be manufactured for practical use. Since the polysilicon thin film has a thickness of about 4 μm at most, microactuators using the above-described plating technique and a single-crystal silicon etching technique (to be described later) are being developed.

To manufacture a microactuator made of single-crystal silicon, the method using an SOI (Silicon On Insulator) substrate described in A. Benitez et al., "Bulk Silicon Microelectromechanical Devices Fabricated from Commercial Bonded and Etched-Back Silicon-on-Insulator Substrates", Sensors and Actuators, A50, pp. 99–103, 1995 (reference 2) can be employed.

According to this method, the movable element electrode 94 and the stationary element electrode 93 in FIG. 14 are formed of a 20-μm thick single-crystal silicon film, and the stationary element base 101 is formed of a silicon oxide film. By removing the silicon oxide film positioned below the movable element electrode 94 using hydrofluoric acid, the movable element electrode 94 can be separated from the silicon substrate 100.

In this case, since the movable element electrode 94 is narrower in width than the stationary element electrode 93, the silicon oxide film is still left below the stationary element electrode 93 even upon etching using hydrofluoric acid, and forms the stationary element base 101. In this manner, the movable element electrode 94 and the stationary element electrode 93 each made of, e.g., a 20-μm thick single-crystal silicon film are formed on the silicon substrate 100.

In the microactuator with a predetermined electrode thickness manufactured in the above manner, if the movable element electrode 94 collides against and attaches to the silicon substrate 100 due to some reason during driving, the movable element 82 stops operating. This typically occurs when the movable element electrode 94 and the stationary element electrode 93 are formed using single-crystal silicon because both the movable element electrode 94 and the silicon substrate 100 have mirror surfaces. The above problem is also frequently posed when the movable element electrode 94 and the stationary element electrode 93 are formed using copper plating.

Recently, the method of effectively solving the above problem is reported in association with a polysilicon microactuator in Y. Yee et al., "Polysilicon Surface Modification Technique to Reduce Sticking of Microstructures", Digest of The 8th International Conference on Solid-State Sensors and Actuators, Vol. 1, pp. 206–209, June 1995 (reference 3).

A method of manufacturing an actuator using this method of solution will be described with reference to FIGS. 15A to 15E.

After an oxide film 121 is formed on a silicon substrate 120, a 0.5-μm thick polysilicon film 122 is formed on the oxide film 121 (FIG. 15A). A PSG oxide film 123 is formed on the polysilicon film 122 (FIG. 15B). At this time, oxidization progresses deep in the grain region of the polysilicon film 122. This sample is dry-etched without any mask to increase differences in thickness of the PSG oxide film 123, and form a polysilicon film 124 having microstructures on the surface (FIG. 15C).

A 2-μm thick PSG film 126 is formed on the polysilicon film 124, and a 2-μm thick polysilicon film 125 is formed on the PSG film 126. The polysilicon film 125 is patterned to have a microactuator electrode shape (FIG. 15D). Finally, the PSG film 126 is removed using hydrofluoric acid to separate an electrode made of the polysilicon film 125 from the surface of the silicon substrate 120 (FIG. 15E).

According to the method described above, the surface of the silicon substrate 120 in contact with the movable element electrode is roughened to decrease the two contact areas, thereby decreasing the attraction force between the solid-state surfaces. The method of reducing friction by forming microstructures on the two contact surfaces has conventionally been reported. For example, the method of arranging projections of an oxide film on the surface of a substrate opposing a movable element is disclosed in Japanese Patent Laid-Open No. 8-23685, "Electrostatic Microactuator" (reference 4).

However, since the projections of the oxide film described in reference 4 are formed by photolithography, the planar size of the projection is much larger than that in the method of roughening the surface, described with reference to FIGS. 15A to 15E. The friction or the attaching force sensitively depends on the degree of surface roughness, so that the characteristics of the microactuator by the manufacturing method described with reference to FIGS. 15A to 15E are superior to the characteristics of the actuator having the conventional projection structure. Further, since the method in FIGS. 15A to 15E does not require photolithography to form microstructures, the whole process can be simplified.

However, the conventional method shown in FIGS. 15A to 15E cannot be applied to the manufacture of a single-crystal silicon actuator using an SOI wafer owing to the following reason.

More specifically, in the manufacturing method using the SOI wafer, an SOI wafer purchased from a semiconductor wafer manufacturer is normally used. This is because the cost is low and the substrate quality is excellent. When a microactuator is to be manufactured using the bought SOI wafer, however, it is essentially impossible to roughen the substrate surface below the movable element using the manufacturing method shown in FIGS. 15A to 15E because films used for the movable element and the stationary element have already been formed.

The conventional microactuator also has the following structural problem. During operation, the movable element attaches to not only the substrate but also the stationary element because the movable element electrodes 94 and the stationary element electrodes 93 complicatedly interdigitated with each other, as shown in FIG. 13. As the electrodes 93 and 94 become thicker, and the interval between the electrodes 93 and 94 becomes narrower, the above problem more frequently occurs.

This problem of attaching the movable element electrode 94 to the stationary element electrode 93 poses common problems in not only the microactuator using the SOI wafer but also all microactuators manufactured by polysilicon and electroplating.

This problem cannot be satisfactorily solved by the manufacturing method described with reference to FIGS. 15A to 15E. This is because the microstructure 124 is formed by dry etching using a plasma aligned in a direction perpendicular to the surface of the silicon substrate 120 in etching the polysilicon film 122 by the method in FIGS. 15A to 15E. That is, this method can be applied to only processing of a surface parallel to the silicon substrate 120.

When the movable element electrode is to be formed of the polysilicon film 122, compression stress acts on the polysilicon film 122 by the oxidization step in FIG. 15B. For this reason, the electrode itself separated from the silicon Substrate 120 deforms.

SUMMARY OF THE INVENTION

It is an object of the present invention to provide a microactuator which can exhibit stable performance by preventing a movable element including a movable element electrode from attaching to a stationary element including a stationary element electrode or a substrate during operation, and a method of manufacturing the same.

It is another object of the present invention to provide a microactuator in which microstructures are formed on the surface of an SOI wafer below a movable element electrode, and a method of manufacturing the same.

In order to achieve the above objects, according to the present invention, there is provided a microactuator comprising a stationary element fixed on a substrate and having a plurality of stationary element electrodes arranged at a predetermined pitch, a movable element having a plurality of movable element electrodes opposing to the stationary element electrodes, the movable element being moved by applying a voltage across the stationary element and the movable element, and a first microstructure formed on at least one of opposing surfaces of the movable element and the stationary element to prevent the movable element from attaching to the stationary element.

BRIEF DESCRIPTION OF THE DRAWINGS

FIG. 4 is an enlarged sectional view of the main part of a microactuator according to the third embodiment of the present invention;

FIG. 5 is an enlarged sectional view of the main part of a microactuator according to the fourth embodiment of the present invention;

FIG. 6 is an enlarged sectional view of the main part of a microactuator according to the fifth embodiment of the present invention;

DESCRIPTION OF THE PREFERRED EMBODIMENTS

The present invention will be described in detail below with reference to the accompanying drawings.

Figure 1:
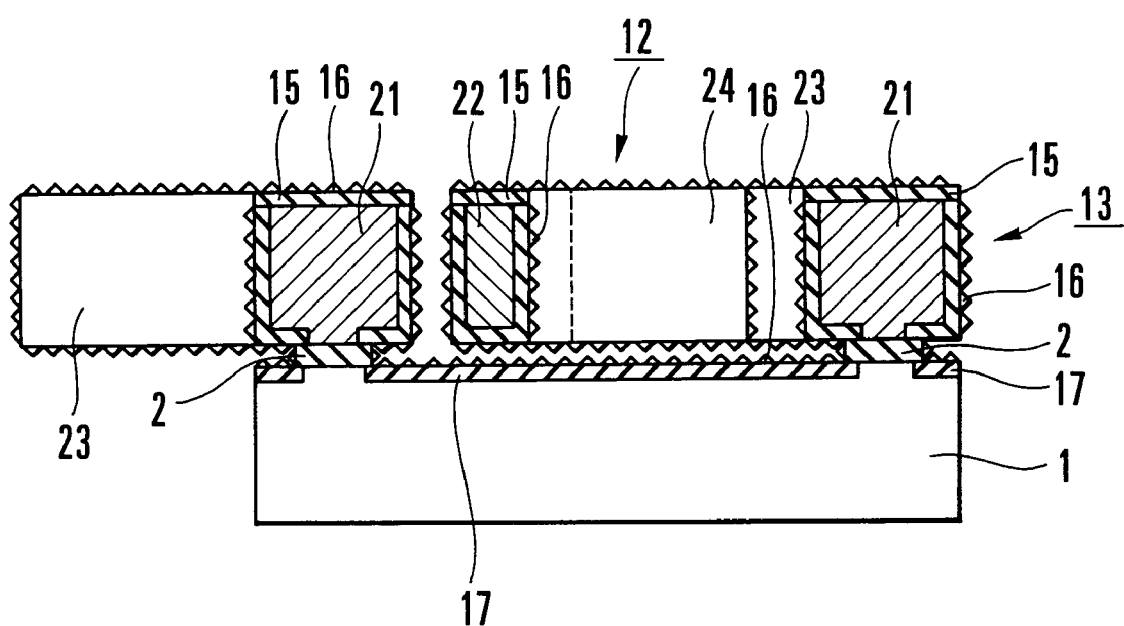
FIG. 1 is an enlarged sectional view of the main part of a microactuator shown in FIG. 2.
Figure 2:
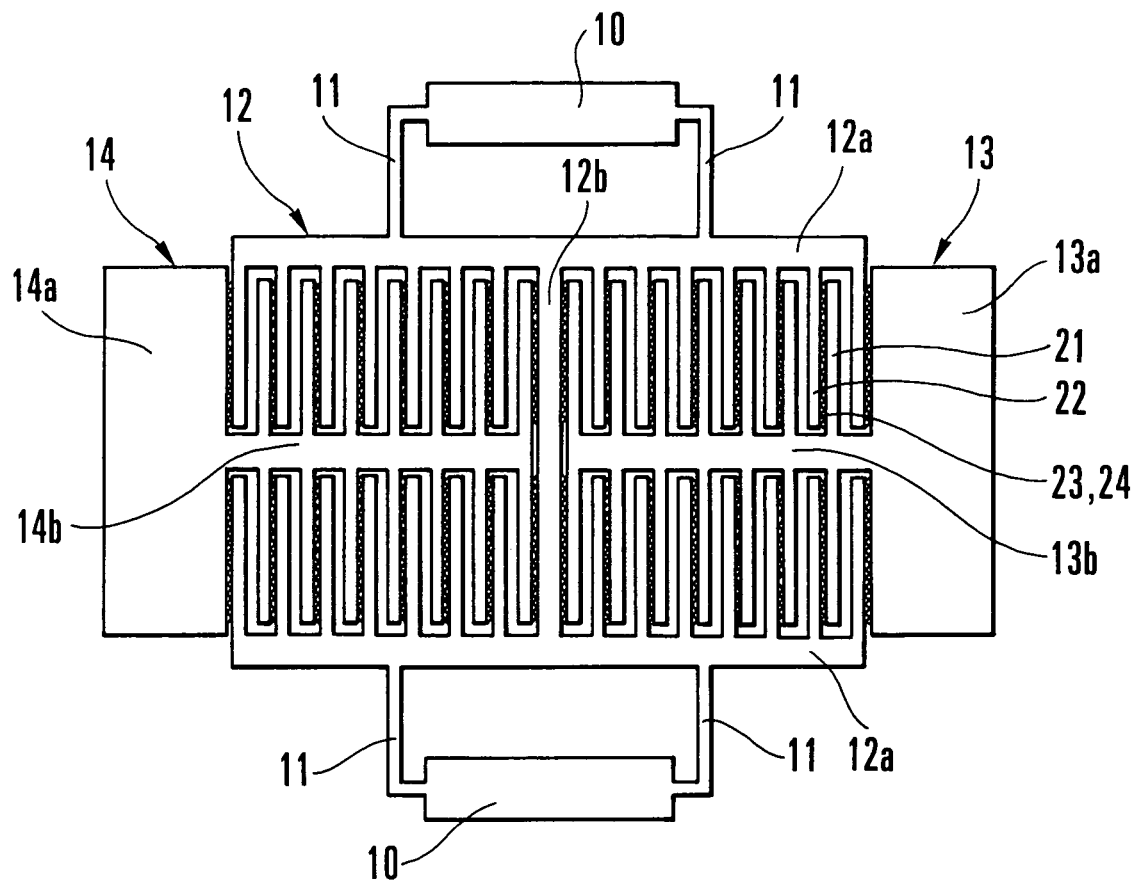
FIG. 2 is a plan view of the microactuator according to the first embodiment of the present invention.

FIG. 1 shows the main part of a microactuator shown in FIG. 2. FIG. 2 shows the microactuator according to the first embodiment of the present invention. In FIG. 2, the microactuator of the first embodiment is constituted by a pair of T-shaped stationary elements 13 and 14 which are formed on a silicon substrate (to be described later) and have leg portions opposing each other, and an H-shaped movable element 12 arranged between the stationary elements 13 and 14. The movable element 12 and the stationary elements 13 and 14 are made of a conductive material. The movable element 12 is supported by four springs 11 to float above the silicon substrate. Each spring 11 is fixed to a spring base 10 fixed to the silicon substrate, and is separated from the surface of the silicon substrate.

Figure 13:
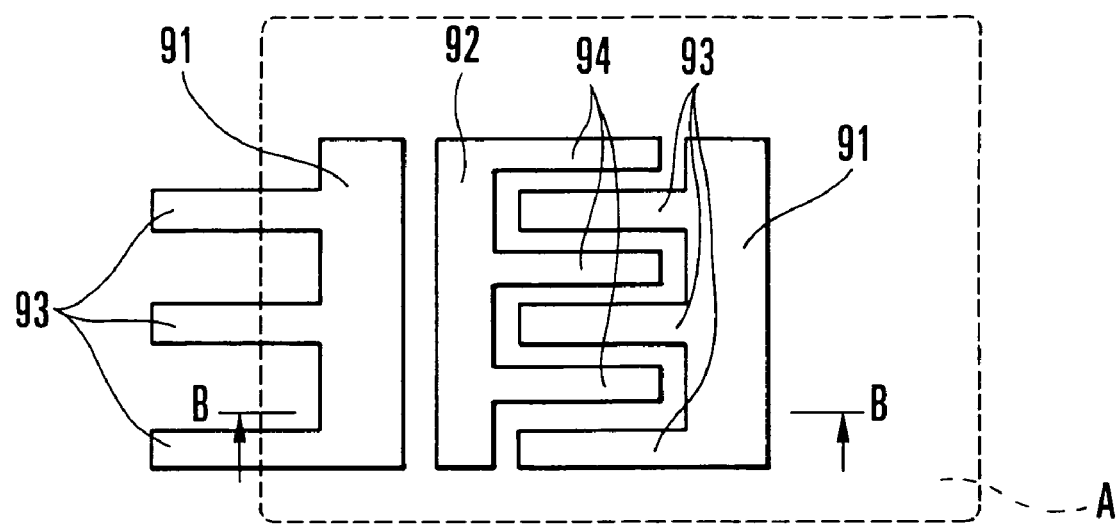
FIG. 13 is an enlarged plan view showing a portion A in FIG. 12.
Figure 14:
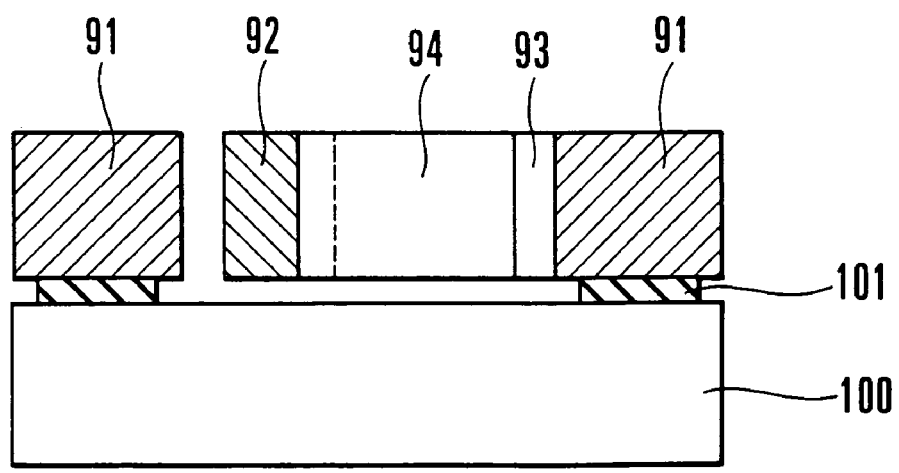
FIG. 14 is a sectional view taken along the line A–A' in FIG. 13.
Figure 15A:
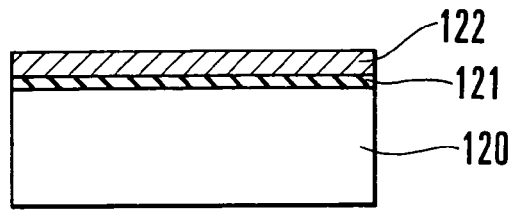
FIGS. 15A to 15E are views, respectively, showing the steps in a method of manufacturing a conventional microactuator.
Figure 15B:
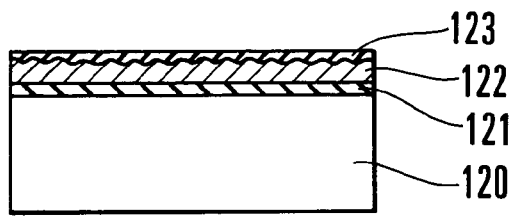
Figure 15C:
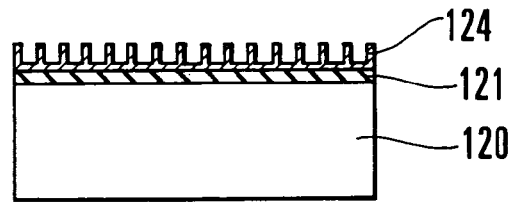
Figure 15D:
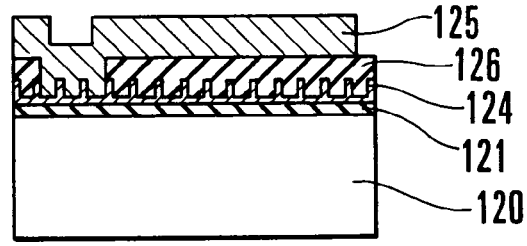
Figure 15E:
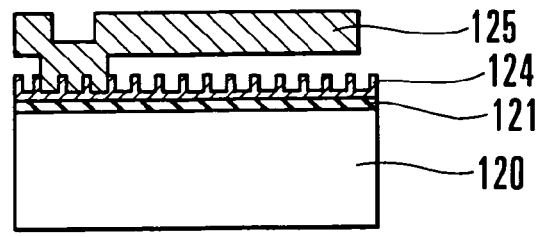

The stationary elements 13 and 14 are respectively made up of main body portions 13a and 14a arranged parallel to each other, and support portions 13b and 14b serving as the leg portions vertically extending from the centers of the main body portions 13a and 14a. The end portions of the support portions 13b and 14b oppose each other. Many comb tooth portions 21 are formed at a predetermined pitch in a comb tooth shape on the two sides of each of the support portions 13b and 14b. Many stationary element electrodes 23 are formed at a predetermined pitch in a comb tooth shape on one side of each comb tooth portion 21, like in FIG. 13.

The movable element 12 is made up of a pair of parallel support portions 12a and a coupling portion 12b coupling the centers of the support portions 12a. The movable element 12 is combined with the stationary element 13. That is, the support portions 12a of the movable element 12 are arranged parallel to sandwich the support portions 13b and 14b of the stationary elements 13 and 14. The coupling portion 12b of the movable element 12 vertically crosses the gap formed by the end portions of the support portions 13b and 14b of the stationary elements 13 and 14.

The movable element 12 comprises many comb tooth portions 22 formed in a comb tooth shape at the same pitch as that between the comb tooth portions 21 of the stationary elements 13 and 14. The comb tooth portions 21 of the stationary elements 13 and 14 and the comb tooth portions 22 of the movable element 12 overlap and interdigitated with each other. Like in FIG. 13, movable element electrodes 24 to be inserted between the stationary element electrodes 23 are formed on one side of each comb tooth portion 22. The comb tooth portion 21 of each of the stationary elements 13 and 14 has a larger width than that of the comb tooth portion 22 of the movable element 12. The stationary element electrode 23 has a larger width than that of the movable element electrode 24.

As shown in FIG. 1, the comb tooth portion 21 formed integrally with the stationary element electrode 23 is fixed to a silicon substrate 1 via a stationary element base 2. In contrast to this, the comb tooth portion 22 formed integrally with the movable element electrode 24 is separated from the surface of the silicon substrate 1.

Insulating films 15 each having a microstructural thin film 16 are formed on the upper, lower, side, and distal end faces of each of the comb tooth portion 21 and stationary element electrode 23 of the stationary element 13 and the comb tooth portion 22 and movable element electrode 24 of the movable element 12. Therefore, all the surfaces of the movable element 12 and the stationary element 13 have microstructures. An insulating film 17 having a microstructural thin film 16 is also formed on at least the surface of the semiconductor substrate 1 opposing the movable element 12.

The comb tooth portion 22 and movable element electrode 24 of the movable element 12 are formed of single-crystal silicon having a width of 3 μm and a height of 20 μm. The comb tooth portion 21 of the stationary element 13 is formed of single-crystal silicon having a width of 10 μm and a height of 20 μm. The stationary element electrode 23 is formed of single-crystal silicon having a width of 3 μm and a height of 20 μm, similar to the movable element electrode 24. In this case, although the stationary element electrode 23 floats from the surface of the semiconductor substrate 1, it does not move even upon application of a voltage because the comb tooth portion 21 is fixed to the semiconductor substrate 1. The insulating film 15 is formed of a 100-nm thick oxide or nitride film or a composite material of them. The microstructural thin film 16 is a 100-nm thick polysilicon film.

The structure of the microactuator of the first embodiment is characterized in that the surface of the semiconductor substrate 1 and the comb tooth portion 21 and stationary element electrode 23 of the stationary element 13 that are in contact with the comb tooth portion 22 and movable element electrode 24 of the movable element 12 are covered with the microstructural thin films 16. Accordingly, when the movable element electrode 24 collides against the semiconductor substrate 1 or the stationary element electrode 23, a force to make the movable element electrode 24 attach to the semiconductor substrate 1 or the stationary element electrode 23 can be greatly reduced.

In the first embodiment, the surfaces of the comb tooth portion 21 and stationary element electrode 23 of the stationary element 13, and the surfaces of the comb tooth portion 22 and movable element electrode 24 of the movable element 12 are covered with the insulating films 15. With this structure, the movable element electrode 24 and the stationary element electrode 23 are prevented from short-circuiting upon collision during driving when a driving voltage is applied across the movable element 12 and the stationary element 13.

According to experiments by the present inventor, the most preferable surface roughness of the microstructural thin film 16 formed on the side surfaces of the movable element electrode 24 and the stationary element electrode 23 is about 50 to 500 nm in practical use. If the electrode surface has a surface roughness of about several ten nm, the surface tension of moisture contained in air that generates a force to attract the two electrodes upon collision is greatly reduced.

To obtain a large driving force by decreasing a voltage applied across the movable element electrode 24 and the stationary element electrode 23, the interval between the two electrodes must be decreased. However, the narrowest interval between the electrodes is about 2 µm at most from manufacturing process conditions. If microstructures are formed on both the electrode surfaces having an interval of 2 µm, the distance between the two electrodes greatly varies due to the microstructures, and the operation characteristics of the microactuator are not stabilized. However, the above microactuator can stand practical use because a thin microstructural surface having a thickness of 500 mm or less hardly influences the operation stability.

Figure 3:
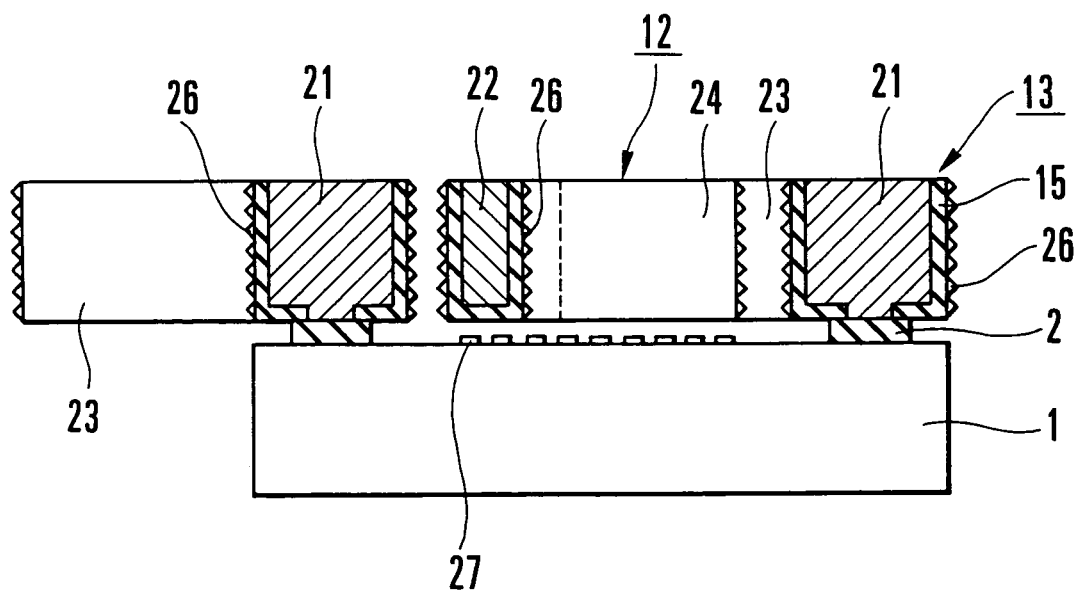
FIG. 3 is an enlarged sectional view of the main part of a microactuator according to the second embodiment of the present invention.

FIG. 3 shows the main part of a microactuator according to the second embodiment of the present invention. In the following description, the same reference numerals as in FIG. 1 denote the same parts, and a description thereof will be omitted.

In the second embodiment, insulating films 15 each having a microstructural thin film 26 are formed on only the opposing side surfaces of a comb tooth portion 21 of a stationary element 13 and a comb tooth portion 22 of a movable element 12, and the distal end faces of a stationary element electrode 23 and a movable element electrode 24. A microstructural thin film 27 is directly formed on the surface of a semiconductor substrate 1 opposing the comb tooth portion 22 and movable element electrode 24 of the movable element 12.

This structure has the following features, compared to the first embodiment shown in FIG. 1.

1) An optical component such as a slit or a mirror, and a component associated with a magnetic head or the like, such as a slider or a suspension, are directly mounted on the comb tooth portion 22 and movable element electrode 24 of the movable element 12. In this case, since the comb tooth portion 22 and the movable element electrode 24 have flat surfaces, these components can be easily mounted to keep predetermined angles in the operation directions of the comb tooth portion 22 and the movable element electrode 24. These components must be accurately mounted with a precision of 0.1 µm or less at predetermined angles with respect to the operation surface of the movable element 12.

2) The microstructural thin film 27 formed on the surface of the semiconductor substrate 1 opposing the comb tooth portion 22 and movable element electrode 24 of the movable element 12 can be formed of a different material by a different manufacturing process from those of the microstructural thin films 26 formed on the side surfaces of the movable element 12 and the stationary element 13. In other words, in removing an oxide film 2, the microstructural thin film 27 can be left below only the comb tooth portion 22 and the movable element electrode 24. In this case, the microstructural thin film 27 is made of the oxide film 2.

The microstructural thin film 26 can be made to have a surface roughness of about 50 to 500 nm, and the microstructural thin film 27 can be made to have a different surface roughness of about 1 µm. This is because the interval between the movable element electrode 24 and the semiconductor substrate 1 need not be made narrow, unlike the electrode interval which must be made as narrow as possible.

To prevent the movable element 12 from attaching to the stationary element or substrate during the operation of the microactuator, the surface roughness is suitably 500 nm or less. To prevent the movable element electrode 24 from attaching to the semiconductor substrate 1 which is caused during the manufacturing process of separating the movable element electrode 24 from the semiconductor substrate 1, a surface roughness having microstructures with a size of about 1 µm is desirable. From these points, the structure of the second embodiment is effective.

By forming the microstructural thin films 26 and 27 having different surface roughnesses in accordance with regions, attaching prevention structures having different materials, different manufacturing processes, and different shapes can be manufactured. This is useful in increasing the degree of freedom for the design and the manufacturing process.

The above embodiments have exemplified the case wherein the microstructural thin films 16, 26, and 27 are formed using polysilicon. However, the present invention is not limited to this and generally includes a material which can be used in a method capable of forming microstructures with a size of about several ten to several hundred nm on the surface. For example, as a material for the microstructural thin films 16, 26, and 27, a metal film such as a tungsten film, a titanium film, or a titanium nitride film formed by CVD (Chemical Vapor Deposition), an insulating film such as an oxide film or a nitride film, a semiconductor film such as an amorphous silicon film, or an organic thin film is available. A method such as sputtering or deposition can be employed. Further, the present invention also includes a combination of these methods.

In the above embodiments, the microstructural thin films 16 and 26 are formed on the insulating films 15 and 17. However, the microstructural thin films 16 and 26 may be directly formed on, e.g., the silicon surface of each of the movable element electrode 24, the stationary element electrode 23, and the semiconductor substrate 1. In this case, if microstructures can be satisfactorily formed on these surfaces, the comb tooth portion 22 and movable element electrode 24 of the movable element 12 can be prevented from attaching to the stationary element electrode or semiconductor substrate.

When a material for forming microstructures is a semiconductor material such as polysilicon or a metal material such as tungsten, electrical short-circuiting occurs upon collision of the movable element electrode 24 and the stationary element electrode 23. To prevent this, such a formation material suffices to be oxidized and changed into an insulating film. If an insulating film such as an oxide film is used as a formation material from the beginning, no process of oxidizing the material upon forming microstructures is required.

FIG. 4 shows the main part of a microactuator according to the third embodiment of the present invention.

In the third embodiment, the upper surfaces of a comb tooth portion 22 and movable element electrode 24 of a movable element 12, and the upper surfaces of a comb tooth portion 21 and stationary element electrode 23 of a stationary element 13 are covered with polysilicon films 38. The surface of a semiconductor substrate 1 opposing the comb tooth portion 22 and movable element electrode 24 of the movable element 12 is covered with a polysilicon film 37.

Also in this structure, the comb tooth portion 22 and movable element electrode 24 of the movable element 12 can be prevented from attaching to the comb tooth portion 21 and stationary element electrode 23 of the stationary element 13 or the surface of the semiconductor substrate 1. Even if the movable element electrode 24 collides against the stationary element electrode 23 during operation, they are not electrically short-circuited.

According to the characteristic feature of the third embodiment, particularly, when a microstructural thin film 36 is formed of polysilicon, selective growth conditions such that a polysilicon film is grown to have a rough surface on an insulating film 15 and a polysilicon film is grown to have a flat surface on silicon. For example, the selective growth conditions are 20%-silane gas, a pressure of 1 Torr, and a deposition temperature of 590 to 630° C. when LPCVD (Low Pressure CVD) is adopted. By using this polysilicon selective growth, a desired microstructural thin film can be formed on only a region where microstructures are required. In addition, the manufacturing process is simplified because of no redundant photolithography.

More specifically, the grain shape of polysilicon formed by LPCVD can be changed by changing the formation temperature. In particular, polysilicon formed at the transition temperature, 590 to 630° C., between amorphous silicon and polysilicon has an undulating shape, and hemispherical microstructures with a size of about several ten to several hundred nm can be easily formed. The specific size and shape are suitable to prevent the movable element electrode from attaching to the substrate or stationary element electrode by attraction caused by the surface tension of water produced by condensation of moisture contained in air when the movable element electrode collides against the substrate or stationary element electrode during operation.

Since polysilicon having such microstructures can be formed by LPCVD, it can be easily formed inside a narrow structure. Microstructures can therefore be formed below the movable element electrode. Further, since microstructures can be easily formed on the opposing surfaces of the movable element electrode and the stationary element electrode 23, the contact area between the movable element electrode and the stationary element electrode in a lateral direction can be reduced.

The above-mentioned method is not limited to polysilicon but is generally applicable to a material to which the selective growth can be used. For example, the present invention also includes tungsten or the like formed by CVD.

In the above-described embodiments, the microstructural thin films are formed on the surfaces of the comb tooth portion 22 and movable element electrode 24 of the movable element 12 and the surfaces of the comb tooth portion 21 and stationary element electrode of the stationary element 13. Instead, the surface of the movable element electrode 24 and the like can be directly etched to form microstructures.

That is, as a method of forming microstructures on the lower or side surface of the movable element electrode 24, after the movable element electrode 24 or the stationary element electrode 23 is formed, its surface can be slightly etched. The etching method includes wet etching using a liquid and dry etching using a gas.

As the microactuator becomes thicker, and the gap between the movable element electrode 24 and the stationary element electrode 23 becomes narrower, a solution is difficult to enter a deep portion in wet etching. Dry etching is therefore more suitable, whereas wet etching can be advantageously performed by a simple apparatus. To form microstructures having a size of several hundred nm on the surface, it is important to find conditions for obtaining a rough etched surface.

In dry etching, for example, the internal pressure of the apparatus is set high to several hundred mTorr using a fluorine-based silicon etching gas such as $SF_6$. On the other hand, in wet etching, a solution prepared by dissolving a silicon powder in a silicon etching solution made of hydrazine, EDP, or the like can be used. It is also effective to mix an organic-component-containing material in an etching solution or a gas.

FIG. 5 shows the main part of a microactuator according to the fourth embodiment of the present invention.

In the fourth embodiment, microstructures 46 are directly formed on the side and lower surfaces of a comb tooth portion 22 and movable element electrode 24 of a movable element 12. Microstructures 46 are also directly formed on the side and lower surfaces of a comb tooth portion 21 and stationary element electrode 23 of a stationary element 13. Microstructures 47 are formed on the surface of a semiconductor substrate 1 opposing the movable element electrode 24. The microstructures 46 and 47 are formed using the same material as a material constituting the movable element electrode 24, the stationary element electrode 23, and the semiconductor substrate 1.

In this structure, since no unwanted residual stress is left in the microactuator, stable characteristics excellent in long-term reliability free from any hysteresis can be realized. Variations in characteristics can be suppressed small even upon changes in ambient temperature. The manufacturing method is simplified in the absence of the manufacturing process of forming a thin film.

In the microactuator having the structure shown in FIG. 5, the movable element electrode 24 and the stationary element electrode 23 may be electrically short-circuited when the movable element electrode 24 collides against the stationary element electrode 23. As one method of preventing this, the microstructures 46 and 47 are oxidized and changed into insulating films. Alternatively, insulating films may be formed on the microstructures 46 and 47. As a method of forming a film conforming to a complicated underlying shape, for example, a nitride film can be formed to a thickness of 100 nm using LPCVD.

FIG. 6 shows the main part of a microactuator according to the fifth embodiment of the present invention.

In the fifth embodiment, microstructural thin films 56 identical to those in the first embodiment in FIG. 1 are formed on the surfaces of a comb tooth portion 22 and movable element electrode 24 of a movable element 12 and the surfaces of a comb tooth portion 21 and stationary element electrode 23 of a stationary element 13. Microstructures 57 identical to those in the fifth embodiment in FIG. 5 are formed on the surface of a semiconductor substrate 1 opposing the comb tooth portion 22 and movable element electrode 24 of the movable element 12.

This structure is characterized in that the manufacturing method can be greatly simplified due to the following reason. In general, microstructures with a step of several ten to several hundred nm can be formed by a thin film with more accurate film thickness and shape than by etching. The microstructures are also more excellent in uniformity.

In the fifth embodiment in FIG. 6, the microstructural thin film 56 to be formed on the side surface of the electrode that must be accurately controlled in film thickness and shape is manufactured using formation of a thin film. To the contrary, the microstructure 57 on the semiconductor substrate 1 which need not be accurately controlled in film thickness and shape is formed by etching the semiconductor substrate 1. This manufacturing process is one appropriate choice to obtain the effects of the present invention.

As in the embodiment in FIG. 1, forming all microstructures only by forming a thin film is a proper choice in a method such as LPCVD using a polysilicon material. However, to form a microstructural thin film on the lower surface of the movable element electrode 24 is generally more difficult than to form it on the side surface of the movable element electrode. This can be understood from the fact that a film is difficult to form in a region shaded by a target in the use of, e.g., a sputtering apparatus.

The structure in FIG. 6 allows to form microstructures at a deep portion where such a thin film is difficult to form, and is plausible because the thin film formation method is employed for a side surface whose shape must be controlled. By using the structure in FIG. 6, many materials described above can be used for the microstructural thin film 56, in addition to polysilicon.

In the above embodiments, microstructures are formed on the opposing side surfaces of the comb tooth portion 22 and movable element electrode 24 of the movable element 12 and the comb tooth portion 21 and stationary element electrode 23 of the stationary element 13. However, the present invention is not limited to this. The same effects can be obtained even if microstructures are formed on only the side surfaces of either the comb tooth portion 22 and movable element electrode 24 of the movable element 12 or the comb tooth portion 21 and stationary element electrode 23 of the stationary element 13.

Microstructures for preventing the movable element electrode 24 from attaching to the substrate or stationary element electrode may also be formed on either one or both of the comb tooth portion 22 and movable element electrode 24 side and the opposing semiconductor substrate 1 side. The insulating film 15 formed to prevent electrical short-circuiting may also be formed on either the comb tooth portion 22 and the movable element electrode 24 or the comb tooth portion 21 and stationary element electrode 23 of the stationary element 13 regardless of the presence/absence of microstructures.

In the above embodiments, the stationary element 13 is arranged on the semiconductor substrate 1. However, the present invention is not limited to this structure and can also be applied when the stationary element 13 is arranged on the movable element 12. The present invention can be applied to a structure in which the movable element 12 is arranged on the stationary element 13. In this manner, the present invention is effective in a microactuator having a structure in which another stationary element or moving member is mounted on the movable element 12 or the stationary element 13.

A method of manufacturing a microactuator according to the present invention will be described below.

Figure 7A:
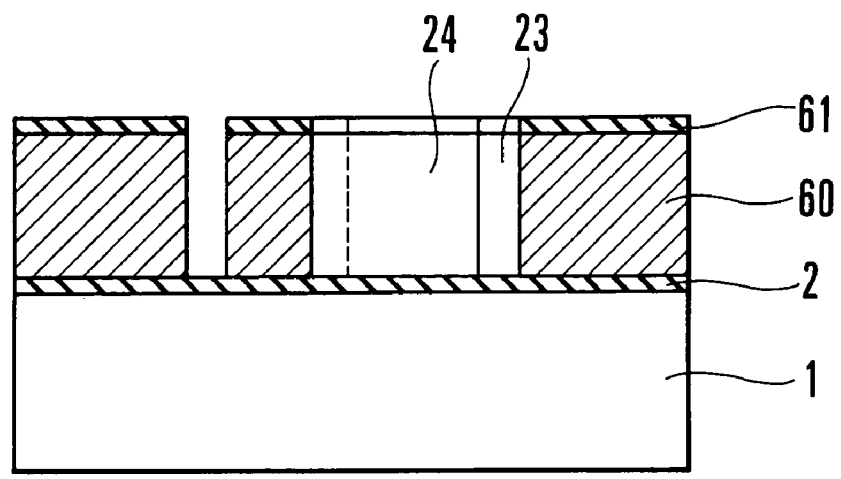
FIGS. 7A to 7C are views, respectively, showing the steps in a method of manufacturing the microactuator shown in FIG. 1.
Figure 7B:
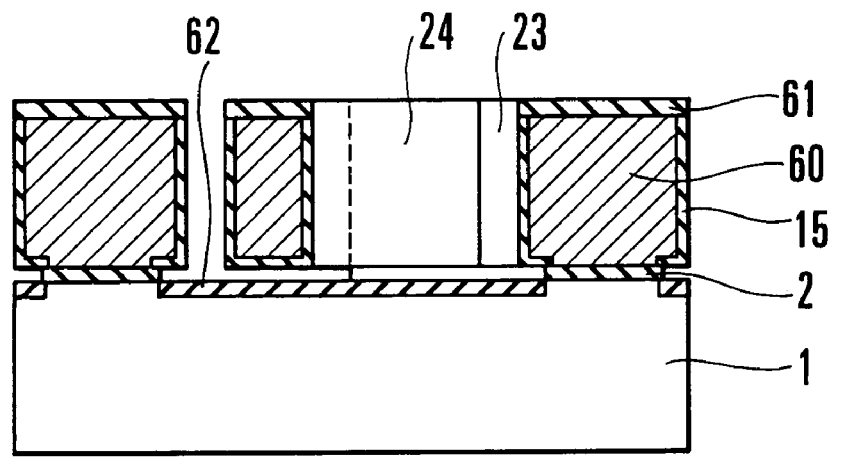
Figure 7C:
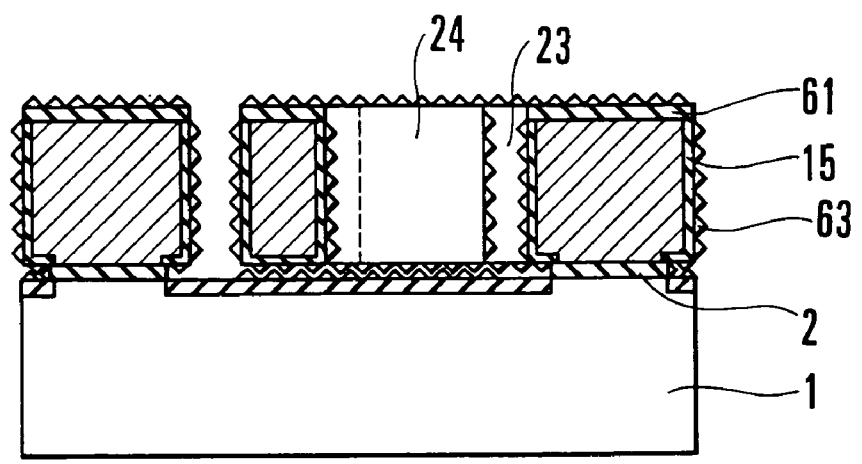

FIGS. 7A to 7C show a method of manufacturing the microactuator in FIG. 1. In this manufacturing method, the manufacturing process starts using an SOI wafer prepared by sequentially forming a 2-µm thick oxide film 2 and a 20-µm thick silicon film 60 on a 500-µm thick semiconductor substrate 1.

After a 3-µm thick oxide film 61 is formed on the silicon film 60, the shape of a microactuator is transferred to the oxide film 61 by patterning using photolithography. The silicon film 60 is etched using the oxide film 61 as a mask by a plasma etching apparatus using chlorine gas (FIG. 7A). The oxide film 2 below a movable element electrode 24 is removed using hydrofluoric acid.

After the hydrofluoric acid is washed using a large amount of water, the sample is dried using a freezed dry apparatus so as to prevent the movable element electrode 24 from attaching to the semiconductor substrate 1. This sample is inserted in a thermal oxidization furnace and an LPCVD apparatus to form insulating films 15 and 62 made up of an oxide film and a nitride film on the surfaces of the stationary element electrode 23 and the movable element electrode 24 and the surface of the semiconductor substrate 1, respectively (FIG. 7B).

Polysilicon is formed on the surface of the sample using LPCVD. A film 63 having large microstructures on its surface is formed of the polysilicon by flowing silane gas diluted to 20% at, e.g., a formation temperature of 600° C. (FIG. 7C).

To form the microactuator in FIG. 3 using this method, an insulating film is formed on the side wall of the silicon film 60 after the step in FIG. 7A. The insulating film is removed except for the side wall by an etch-back process using dry etching, and then polysilicon is formed on the side wall and upper surface of the silicon film 60. The upper surface of the silicon film 60 is polished by a polishing process to form a flat structure. Subsequently, the oxide film 2 is removed to form a movable element electrode 24 and a stationary element electrode 23. At this time, microstructural thin films 26 and 27 shown in FIG. 3 can be formed by controlling the etching time to remove the insulating film.

To manufacture the microactuator in FIG. 4, the time to remove the oxide film 2 is prolonged in the method of manufacturing the microactuator in FIG. 3 so as not to leave the microstructural thin film 27 on the surface of the semiconductor substrate 1. Thereafter, polysilicon is formed again.

Figure 8A:
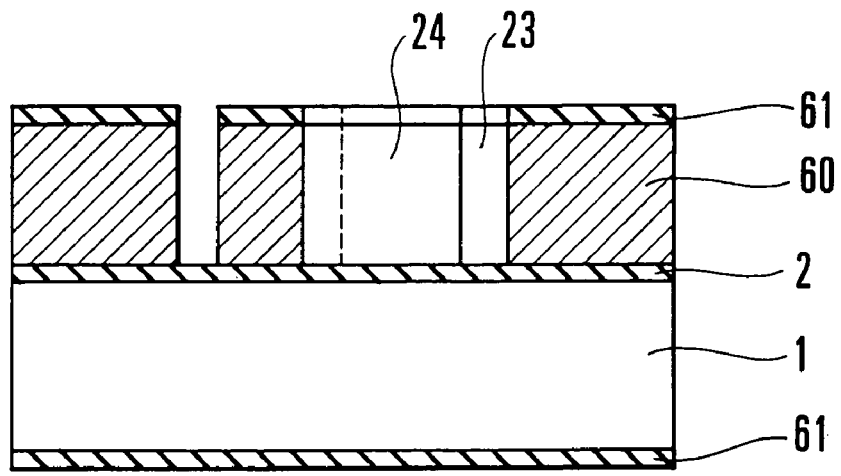
FIGS. 8A to 8C are views, respectively, showing the steps in a method of manufacturing the microactuator shown in FIG. 5.
Figure 8B:
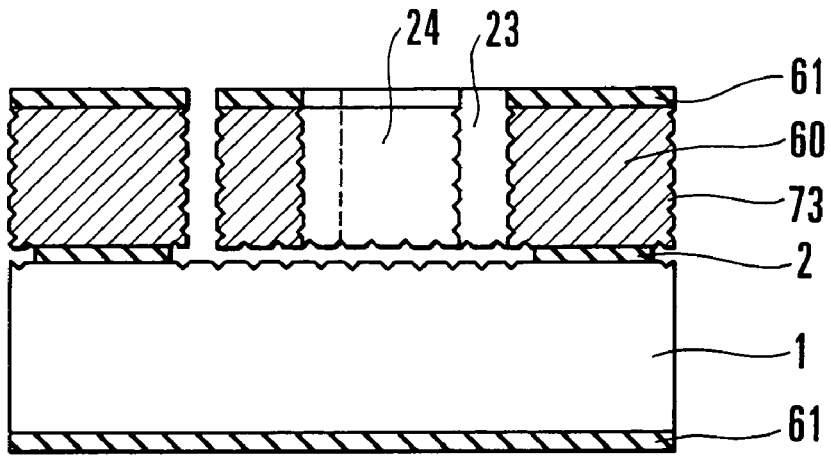
Figure 8C:
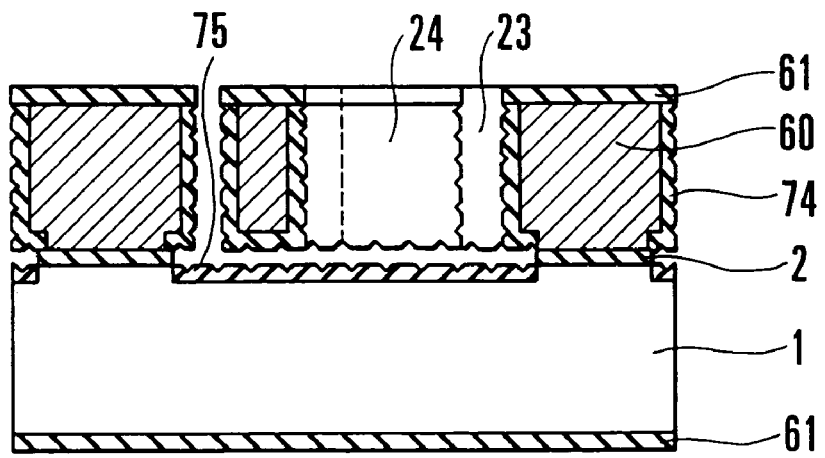

FIGS. 8A to 8C show a method of manufacturing the microactuator in FIG. 5. In this manufacturing method, the process starts using an SOI wafer prepared by sequentially forming a 2-µm thick-oxide film 2 and a 20-µm thick silicon film 60 on a 500-µm thick semiconductor substrate 1.

After 3-µm thick oxide films 61 are formed on the surface of the silicon film 60 and the lower surface of the semiconductor substrate 1, the shape of a microactuator is transferred to the oxide film 61 by patterning using photolithography. The silicon film 60 is etched using the oxide film 61 as a mask by a plasma etching apparatus using chlorine gas (FIG. 8A). The oxide film 2 below a movable element electrode 24 is removed using hydrofluoric acid.

After the hydrofluoric acid is washed using a large amount of water, the sample is inserted in etching solution to etch the surface of the silicon film 60 (FIG. 8B). At this time, the sample is dipped for about 1 min in a solution prepared by heating, to about 150° C., EDP (EthyleneDiaminePyrocatechol) in which, e.g., a silicon powder is sufficiently dissolved in advance. Accordingly, microstructures 73 shown in FIG. 8C are formed on the surface of the silicon film 60.

It is important to etch the surface of the silicon film 60 without drying the sample after the oxide film 2 is removed. Otherwise, the movable element electrode 24 separated from the semiconductor substrate 1 may attach to the semiconductor substrate 1. As a matter of course, this problem can be solved by using the drying method such as freezed drying described in FIGS. 7A to 7C.

According to the outstanding characteristic feature of this manufacturing method, silicon is etched without drying the sample immediately after the oxide film 2 is etched upon the step in FIG. 8A. Attaching the movable element electrode 24 to the substrate 1 can be prevented by paying attention to only formation of the microstructure 73 on the surface of the silicon film 60. For this reason, a cumbersome process such as freezed drying can be omitted.

To prevent electrical short-circuiting, the sample is oxidized in a thermal oxidization furnace to form microstructural thin films 74 and 75 made of an oxide film, as shown in FIG. 8C. The oxide film 61 formed on the lower surface of the semiconductor substrate 1 protects the semiconductor substrate 1 in etching the surface of the silicon film 60 in the step in FIG. 8B.

According to the above-described manufacturing methods, microstructures are formed on the side surface of the movable element electrode 24. As far as the size of the microstructure is about several hundred mm or less, the microactuator can be stably driven in most applications even upon applying a voltage across electrodes having the microstructures. In certain fields such as modulation of the light wavelength and driving of a magnetic head, however, the microactuator must be driven with a precision of 10 m or less.

To apply the microactuator of the present invention to such a field and precisely drive the microactuator, the side surface of the movable element electrode 24 or the stationary element electrode 23 is desirably flat. Still another embodiment of a microactuator which meets this demand and has a structure for preventing the movable element electrode from attaching to the stationary element electrode or substrate, as an object of the present invention, will be described below.

Figure 9:
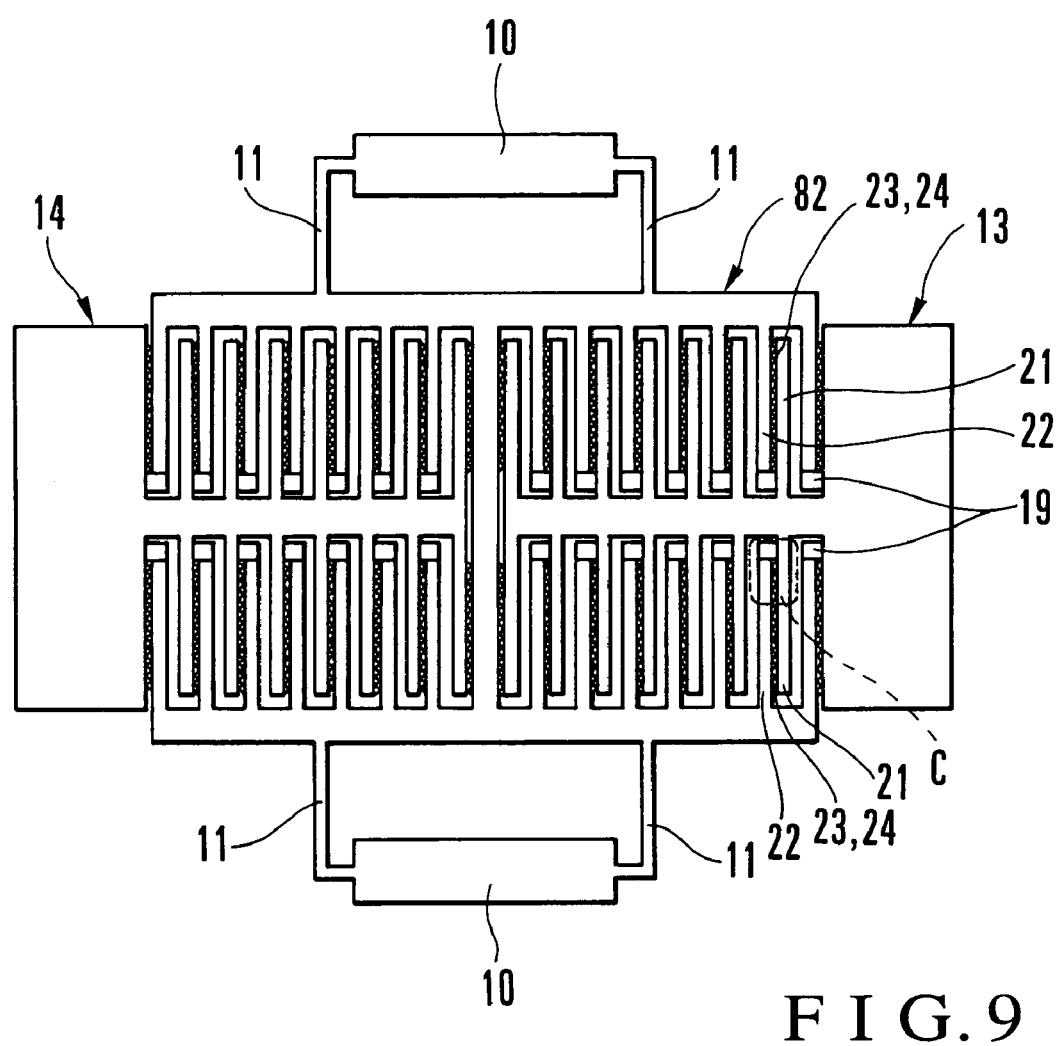
FIG. 9 is a plan view of a microactuator according to the sixth embodiment of the present invention.

FIG. 9 shows a microactuator according to the sixth embodiment of the present invention. The same reference numerals as in FIG. 2 denote the same parts, and a description thereof will be omitted.

Figure 10:
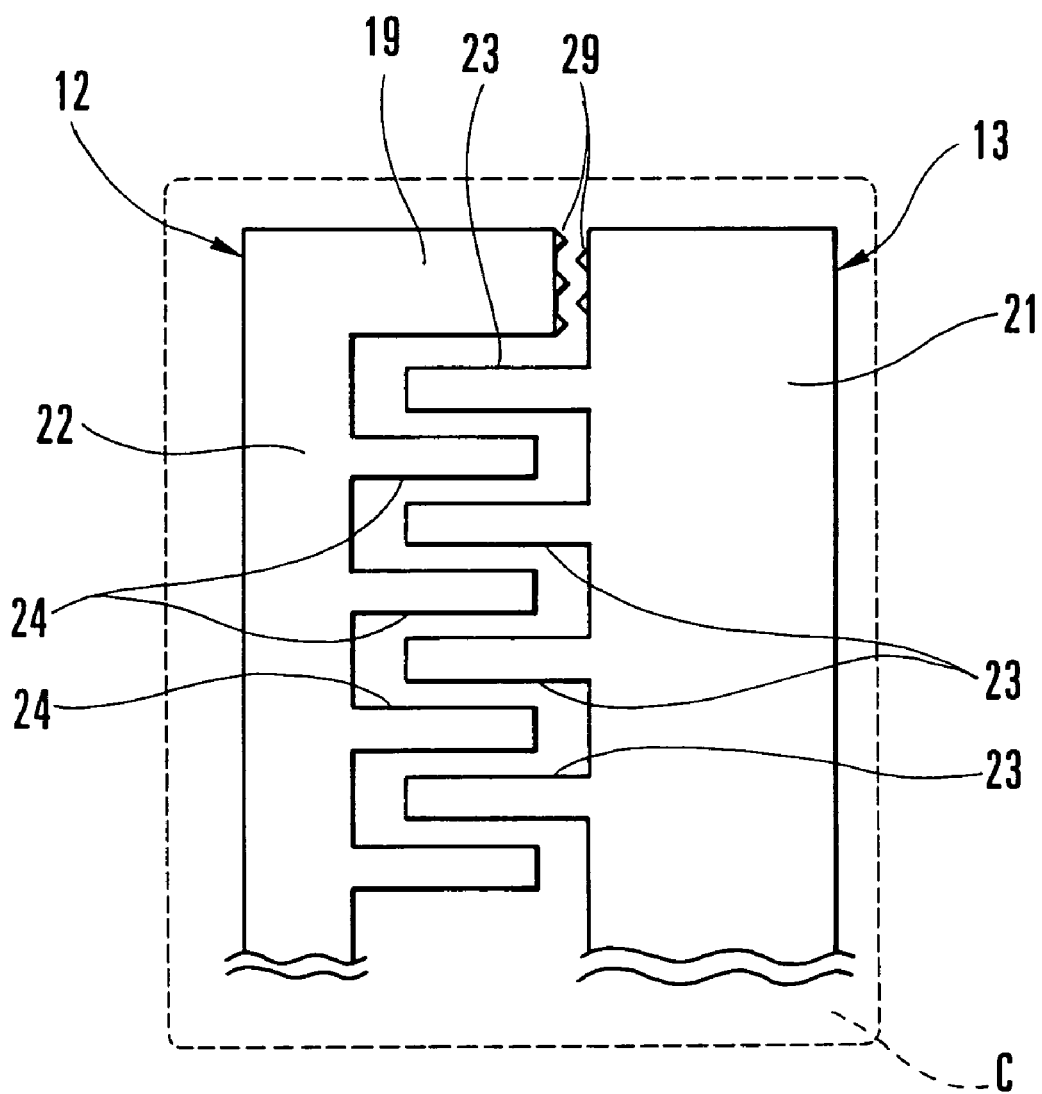
FIG. 10 is an enlarged plan view showing a portion C in FIG. 9.

The microactuator in the sixth embodiment is different from the one shown in FIG. 2 in that a stopper 19 is formed integrally with the distal end portion of a comb tooth portion 22 of a movable element 12. As shown in FIG. 10, the stopper 19 is formed by bending the distal end portion of the comb tooth portion 22 of the movable element 12 toward a comb tooth portion 21 of a stationary element 13 or 14.

The interval between the stopper 19 and the comb tooth portion 21 of the stationary element 13 opposing the stopper 19 is set narrower than the interval between the distal end portion of a movable element electrode 24 and the comb tooth portion 21 of the stationary element 13 and the interval between the distal end portion of the stationary element electrode 23 and the comb tooth portion 22 of the movable element 12. With this structure, even if the stopper 19 contacts the comb tooth portion 21 of the stationary element 13 during the operation of the movable element 12, the movable element electrode 24 does not contact the comb tooth portion 21 of the stationary element 13.

In the sixth embodiment, microstructural thin films 29 are formed on the distal end face of the stopper 19 and the side surface of the comb tooth portion 21 of the stationary element 13 so as to prevent the stationary element 13 from attaching to the stopper 19 even when the stopper 19 contacts the stationary element 13.

According to this arrangement, even when almost all the side surfaces of the electrodes are made flat, the attaching force upon contact can be greatly decreased. Although the sixth embodiment has exemplified the case wherein the stopper 19 is formed at the distal end of the comb tooth portion 22 of the movable element 12, the same effects can be obtained if the stopper is formed on the comb tooth portion 21 of the stationary element 13 or 14. Stoppers may be formed on both the movable element 12 and the stationary elements 13 and 14. The formation position of the stopper 19 is not limited to the distal end portion of the comb tooth portion 22 of the movable element 12 so long as the stopper 19 is formed at a portion where the movable element 12 opposes the stationary element 13 or 14.

To form microstructures on the distal end face of the stopper, in the manufacturing method described with reference to FIGS. 7A to 7C, an insulating film is left in only a microstructure formation region using photolithography, and removed from the remaining region. After that, polysilicon is selectively grown.

Figure 11:
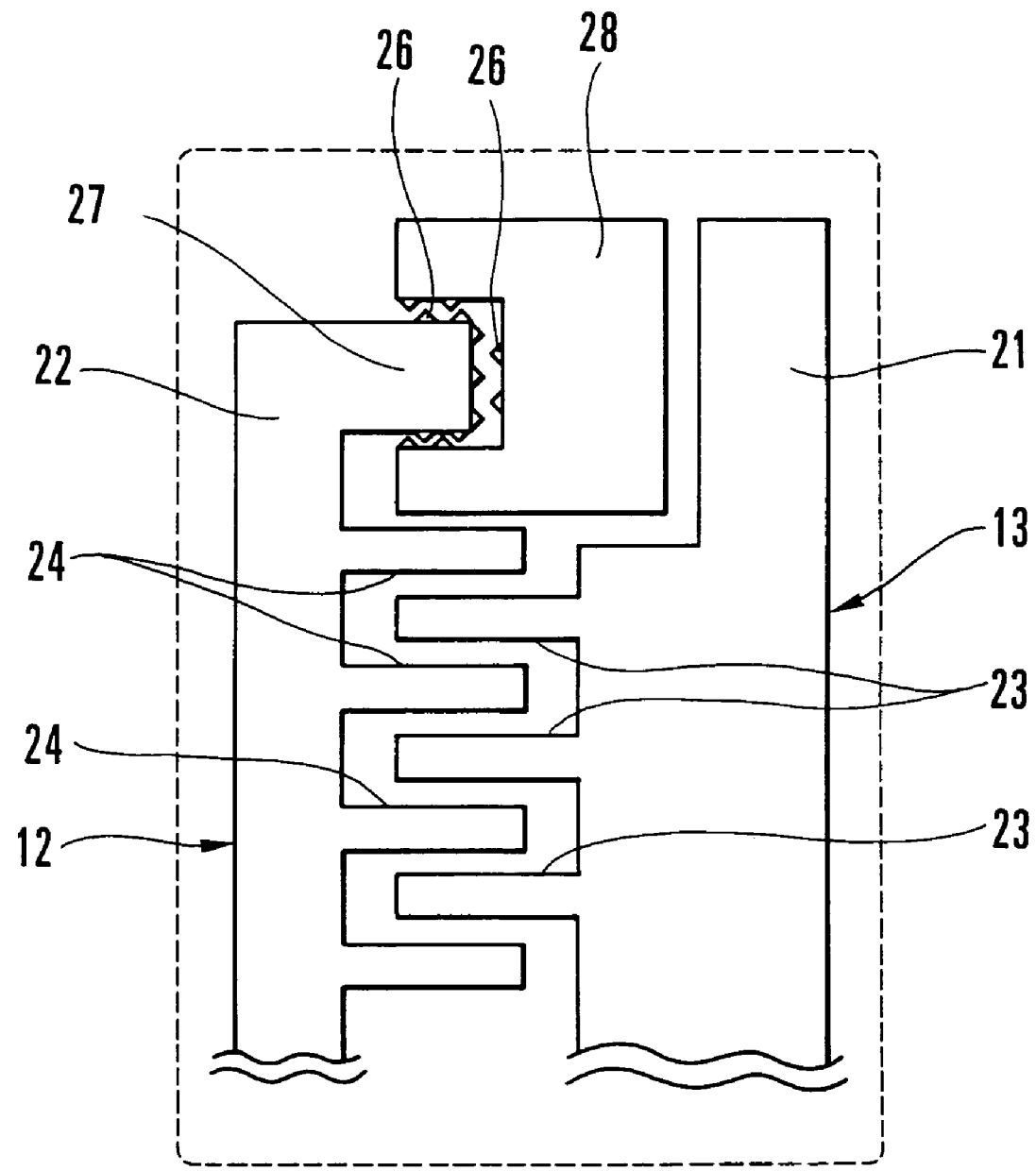
FIG. 11 is a plan view of a microactuator according to the seventh embodiment of the present invention.
Figure 12:
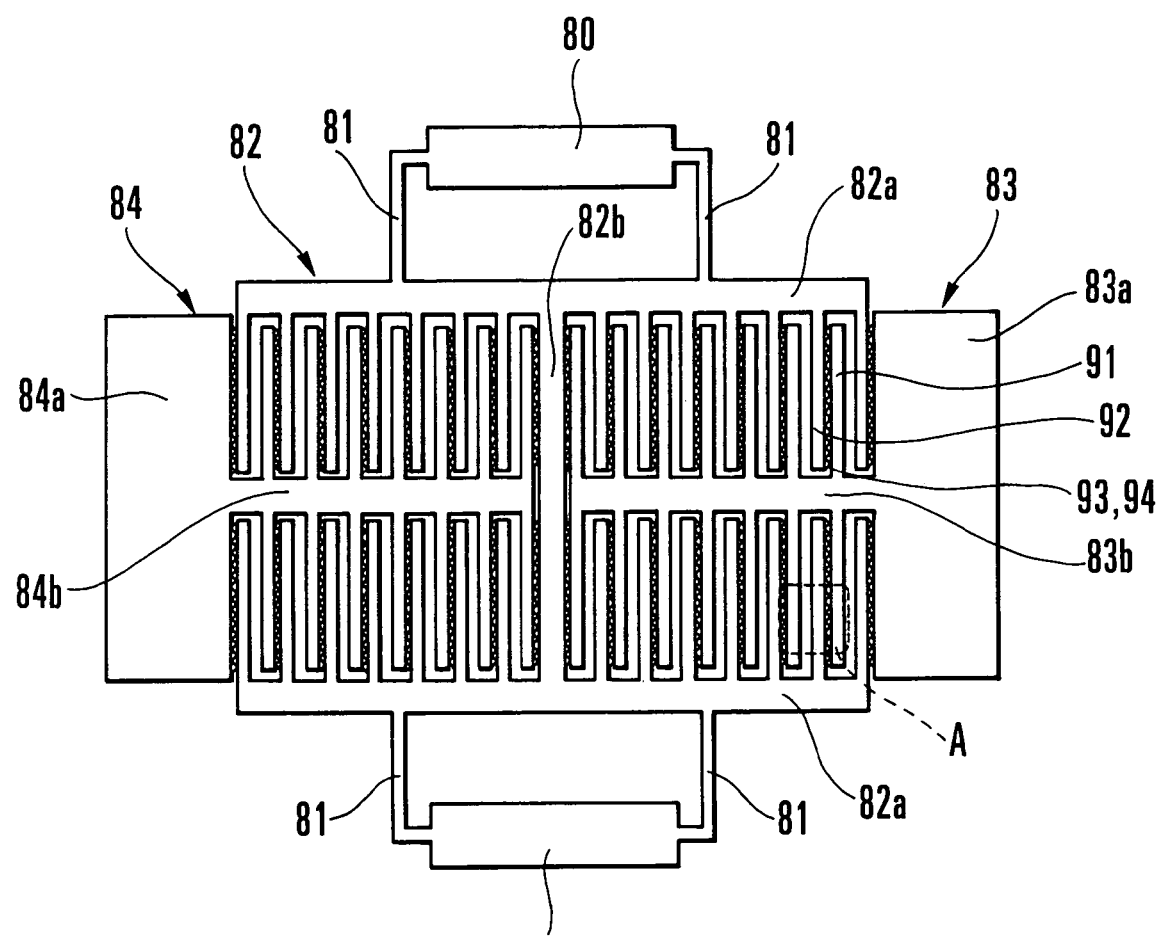
FIG. 12 is a plan view of a conventional microactuator.

FIG. 11 shows the main part of a microactuator according to the seventh embodiment of the present invention.

In the seventh embodiment, a first stopper (first engaging member) 27 is formed at the distal end portion of a comb tooth portion 22 of a movable element 12, and a second stopper (second engaging member) 28 surrounding three sides of the first stopper 27 and having a U shape when viewed from the top is arranged. The second stopper 28 is separated from a stationary element 13 and fixed to a semiconductor substrate. Microstructural thin films 26 are formed on the opposing surfaces of the first and second stoppers 27 and 28.

The second stopper 28 is electrically connected to the semiconductor substrate and set to have the same potential as that of a movable element electrode 24. The entire surfaces of the movable element electrode 24 and a stationary element electrode 23 can be made flat. As a result, a microactuator having very stable driving characteristics with respect to an application voltage can be formed.

The interval between the first and second stoppers 27 and 28 is set narrower than the interval between the movable element electrode 24 and the stationary element electrode 23. For this reason, even if the movable element electrode 24 moves in the longitudinal direction of the comb tooth portion 22, the movable element electrode 24 does not contact the stationary element electrode 23. The microstructural thin films 26 formed on the opposing surfaces of the first and second stoppers 27 and 28 have the same attaching prevention effects as those described above.

The first to fifth embodiments have exemplified the case wherein microstructures are formed on the surfaces of the comb tooth portion 22 and movable element electrode 24 of the movable element 12 and the surfaces of the comb tooth portion 21 and stationary element electrode 23 of the stationary element 13. The present invention is not limited to this. Microstructures may be formed on only the opposing surfaces of the comb tooth portion 22 and movable element electrode 24 of the movable element 12 and the comb tooth portion 21 of the stationary element 13, the opposing surfaces of the comb tooth portion 22 of the movable element 12 and the stationary element electrode 23, and the opposing surfaces of the comb tooth portion 22 of the movable element 12 and the comb tooth portion 21 of the stationary element 13.

As has been described above, according to the present invention, the following effects can be obtained.

1) The problem that the movable element electrode attaches to the stationary element electrode during the operation of the microactuator, and the microactuator stops operating is solved. Attaching does not occur even upon the driving of the microactuator over a time 100 times longer than the conventional time. From this, the improvement exhibits satisfactory effects.

2) Since microstructures are also formed on the lower surface of the movable element electrode or the surface of the substrate opposing the movable element electrode, attaching the movable element electrode to the substrate is also prevented. The structure formed by the present invention provides a finer microstructure than a microstructure formed using photolithography as one of the prior arts. Therefore, the surface tension caused by condensation of moisture contained in air is effectively reduced. According to experiments by the present inventor, the microactuator of the present invention operated over a time 10 times longer without any attaching failure.

3) By using the method of forming polysilicon on the surface of the movable element electrode or the stationary element electrode, the shape of the microstructure to be formed can be changed by changing the polysilicon film thickness, the formation temperature, the pressure, and the like. For example, when polysilicon is formed at a pressure of 1 Torr and less than 590° C., a flat surface having a surface roughness of 10 nm or less can be obtained. To the contrary, if a 100-nm thick polysilicon film is formed at 590 to 630° C., microstructures having a desired shape within the range of 50 to 500 nm can be formed by setting the formation temperature.

Polysilicon formed by LPCVD has the property of entering the interior of a narrow structure and easily forming polysilicon on the surface of the structure. Further, polysilicon can be changed into an oxide film by oxidizing the sample after forming the polysilicon.

The oxide film can be removed to form a structure having large microstructures identical to those shown in FIGS. 15A to 15E. Owing to these features, polysilicon using LPCVD can be used more widely than another material.

4) Polysilicon having hemispherical microstructures is particularly suitable for reducing the surface tension of small water droplets produced by condensation of moisture in air. At the same time, since the area of polysilicon joined to the movable element and the stationary element are large, polysilicon having hemispherical microstructures has a large coupling force to the electrodes. Since the electrodes point-contact each other at the tops of the hemispheres upon collision, the surface tension causing attaching can be greatly reduced.

5) By combining insulating microstructures or microstructures and insulating films, electrical short-circuiting can be prevented even if the movable element electrode collides against the stationary element electrode during the operation of the microactuator. Consequently, the reliability of the actuator is remarkably improved.

6) By using the stopper structure, attaching the movable element can be prevented while the interval between the movable element electrode and the stationary element electrode opposing each other is kept almost constant. As a result, the microactuator can be driven with a high precision of 10 nm or less. This satisfies a strict precision required to microactuators for modulation of the light wavelength, a magnetic head, and the like.

What is claimed is:

1. A method of manufacturing a micromechanical structure, comprising the steps of:
    forming a stationary element having a stationary element electrode and a movable element having a movable element electrode on a semiconductor substrate, said movable element being formed to be separated from a surface of said semiconductor substrate and movable in a direction parallel to said surface of said semiconductor substrate; and
    forming a protuberance on said movable element and opposing surfaces of said stationary element.

2. A method according to claim 1, wherein the step of forming said protuberance comprises the step of forming a polysilicon thin film on said movable element and said opposing surfaces of said stationary element to form a protruding shape on a surface of said polysilicon thin film.

3. A method according to claim 1, wherein the step of forming said protuberance comprises the step of etching said movable element and said opposing surfaces of said stationary element to form a protruding shape.

4. A method of manufacturing a micromechanical structure, said micromechanical structure comprising:
    a substrate on which an insulation film is at least partly formed;
    a stationary element fixed on said insulating film of said substrate, and having a plurality of stationary element electrodes arranged at a predetermined pitch;
    a movable element supported above said substrate by a spring member, said movable element having a plurality of movable element electrodes interdigitized with said stationary element electrodes, said movable element movable in a direction parallel to a surface of said substrate, wherein said stationary element and said movable element each have respective opposing surfaces which are substantially perpendicular to said surface of said substrate; and
    a protuberance formed on at least one of said opposing surfaces of said movable element and said stationary element,
said method comprising:
    etching a semiconductor layer formed on said substrate to define a structure of said stationary element and said movable element,
    wherein said etching includes forming said protuberance on at least one of said opposing surfaces of said movable element and said stationary element.

5. A method according to claim 4, wherein at least a surface of said stationary element and movable element is formed of polysilicon, and wherein said etching etches said polysilicon.

6. A method according to claim 4, wherein the forming said protuberance further comprises forming a polysilicon thin film on said movable element and said opposing surfaces of said stationary element to form a protruding shape on a surface of said polysilicon thin film.

7. A method according to claim 4, wherein the forming said protuberance comprises etching said movable element and said opposing surfaces of said stationary element to form a protruding shape.

* * * * *